(12) United States Patent
Hosoya et al.

(10) Patent No.: US 7,700,245 B2
(45) Date of Patent: Apr. 20, 2010

(54) REFLECTIVE MASK BLANK, REFLECTIVE MASK, AND METHOD OF MANUFACTURING SEMICONDUCTOR DEVICE

(75) Inventors: Morio Hosoya, Tokyo (JP); Tsutomu Shoki, Tokyo (JP)

(73) Assignee: Hoya Corporation, Shinjuku-ku, Tokyo (JP)

( * ) Notice: Subject to any disclaimer, the term of this patent is extended or adjusted under 35 U.S.C. 154(b) by 744 days.

(21) Appl. No.: 11/416,208

(22) Filed: May 3, 2006

(65) Prior Publication Data

US 2007/0275308 A1    Nov. 29, 2007

(51) Int. Cl.
*G03F 1/00* (2006.01)
*B32B 17/10* (2006.01)

(52) U.S. Cl. .......................................... 430/5; 428/430

(58) Field of Classification Search .................... 430/5, 430/322, 323, 324; 428/428, 430; 378/35
See application file for complete search history.

(56) References Cited

U.S. PATENT DOCUMENTS 6,905,801 B2 * 6/2005 Liang et al. ..................... 430/5
6,908,713 B2 * 6/2005 Silverman ....................... 430/5
7,348,105 B2 * 3/2008 Ishibashi et al. ................ 430/5
7,390,596 B2 * 6/2008 Ishibashi et al. ................ 430/5
2004/0253426 A1 * 12/2004 Yakshin et al. .............. 428/212

FOREIGN PATENT DOCUMENTS

JP          7-27198 B2     3/1995
JP       2002-122981 A    4/2002

* cited by examiner

*Primary Examiner*—Stephen Rosasco
(74) *Attorney, Agent, or Firm*—Sughrue Mion, PLLC (57) ABSTRACT

A reflective mask blank and a reflective mask each have, on a multilayer reflective film, a protective film that protects the multilayer reflective film from etching during pattern formation of an absorber layer or a buffer layer formed on the protective film. The protective film is formed by a ruthenium compound containing ruthenium (Ru) and at least one selected from the group consisting of molybdenum (Mo), niobium (Nb), zirconium (Zr), yttrium (Y), boron (B), titanium (Ti), and lanthanum (La). A reflection enhancement film of Ru may be further formed on the surface of the protective film.

9 Claims, 5 Drawing Sheets

REFLECTIVE MASK BLANK, REFLECTIVE MASK, AND METHOD OF MANUFACTURING SEMICONDUCTOR DEVICE

BACKGROUND OF THE INVENTION

This invention relates to an exposure reflective mask for use in manufacturing a semiconductor device or the like, a reflective mask blank from which the mask is obtained, and a method of manufacturing a semiconductor device by the use of such a reflective mask.

In recent years, as semiconductor devices have been miniaturized more and more, extreme ultraviolet (abbreviated to EUV below) lithography has been considered as an exposure technique that uses EUV light and has been expected to be promising in the semiconductor industry. The EUV light may be defined as light in a wavelength band of the soft X-ray region or the vacuum ultraviolet ray region and, specifically, may be light that has a wavelength of about 0.2 to 100 nm. As a mask for use in the EUV lithography, there has been proposed an exposure reflective mask as described, for example, in Japanese Examined Patent Publication (JP-B) No. H07-27198 (namely, 27198/1995) (will be referred to as Document 1).

Such a reflective mask has a multilayer reflective film formed on a substrate to reflect exposure light and further has an absorber layer formed in a pattern on the multilayer reflective film to absorb the exposure light. The exposure light incident on the reflective mask disposed in an exposure apparatus (pattern transfer apparatus) is absorbed at a portion where the absorber layer is present, while, is reflected by the multilayer reflective film at a portion where the absorber layer is not present. As a result, a reflected optical image from the reflective mask is transferred onto a semiconductor substrate through a reflective optical system.

Figure 3:
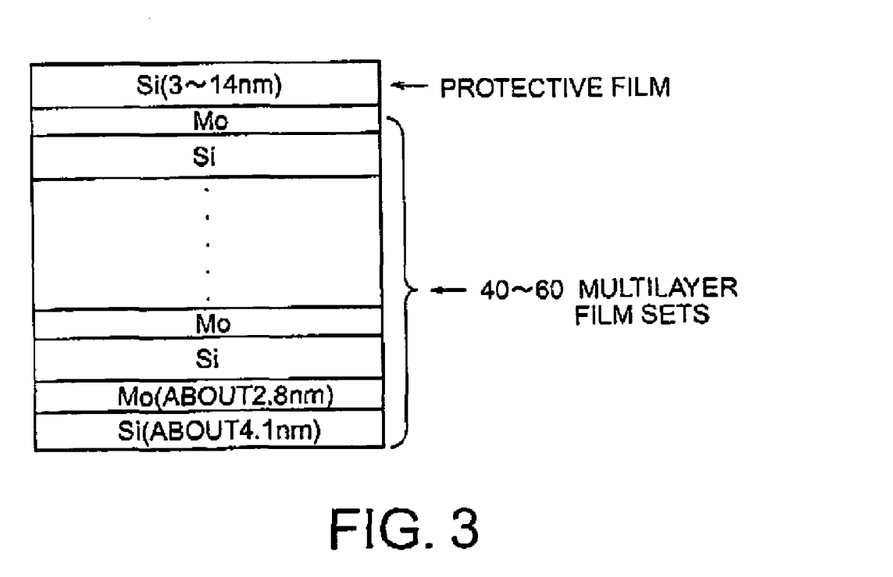
FIG. 3 is a sectional view of a conventional Mo film/Si film set multilayer reflective film.

As the foregoing multilayer reflective film, a stacked film adapted to reflect EUV light of 13 to 14 nm is known which is formed by stacking Mo and Si films each having a thickness of several nm, as shown in FIG. 3. Specifically, the Mo and Si films are alternately laminated in set and stacked by about 40 to 60 sets. In order to increase the reflectance, it is desirable that the Mo film having a high refractive index be formed as an uppermost layer of the multilayer reflective film. However, Mo is quickly oxidized when exposed to the atmosphere and, as a result, the reflectance is lowered. In view of this, as a protective film for preventing oxidation, the Si film, for example, is arranged as the uppermost layer.

On the other hand, Japanese Unexamined Patent Application Publication (JP-A) No. 2002-122981 (will be referred to as Document D2) discloses a reflective mask which has a buffer layer of ruthenium (Ru) formed between an absorbent pattern and a multilayer reflective film composed of Mo films and Si films alternately laminated.

In the case where the Si film is disposed as the protective film at the uppermost portion of the multilayer reflective film as described above, the oxidation preventing effect cannot be sufficiently achieved if the thickness of the Si film is thin. Taking this into account, the Si film is normally deposited to a thickness enough to prevent oxidation. However, this structure brings about a problem that the reflectance is reduced as the thickness of the Si film increases, because the Si film slightly absorbs the EUV light.

Further, when the Ru film is arranged between the multilayer reflective film and the absorbent pattern as described in Document D2, the following problems take place.

(1) As described in Document D2, the Si film is usually arranged as the uppermost layer of the multilayer reflective film and, further, contacts with the Ru film deposited as the buffer layer. With this structure, the Ru film tends to be diffused into the Si film placed at the uppermost layer of the multilayer reflective film and forms a diffusion layer. Such diffusion is caused to occur during deposition of the Ru film and heat treatment or the like thereafter and such a diffused layer undesirably reduces the reflectance.

(2) In the case of the multilayer reflective film in the reflective mask, it is required to have resistance to environment during pattern formation of the absorber layer or environment of pattern formation of a buffer layer when the buffer layer is formed between the multilayer reflective film and the absorber layer. That is, it is also necessary to consider a condition that a material of a protective film formed on the multilayer reflective film should exhibit a large etching selectivity to the absorber layer and/or the buffer layer.

For example, when the absorber layer is made of a Ta-based material, there is a case where a buffer layer of a Cr-based material is formed to avoid etching damage to the multilayer reflective film during pattern formation of the absorber layer and, after the patterning of the absorber layer, the Cr-based buffer layer is also patterned. The Cr-based buffer layer is normally patterned by dry etching by the use of a chlorine-based gas containing oxygen. However, since the Ru film has a low etching resistance to the chlorine-based gas containing oxygen in an amount of 70% or more, the multilayer reflective film is damaged to thereby cause a reduction in reflectance.

(3) It is to be noted here that the protective layer is inevitably and physically reduced in thickness due to etching during the pattern formation of the absorber layer or the Cr-based buffer layer. In recent years, the etching conditions to the protective film tend to be strict in terms of reduction in processing size so that the protective film requires a thickness that can fully withstand the etching for a long time. However, the Ru film has a narrow optimal thickness range in which high reflectance can be achieved and in which the Ru film should have a comparatively thin thinckness. Moreover, even if the Ru film is formed with a thickness within such an optimal thickness range, it cannot withstand etching for a long time so that the multilayer reflective film is subjected to etching damage. As a result, a reduction in reflectance occurs. Further, the thickness reduction of the protective film due to the etching during the pattern formation of the absorber layer or the Cr-based buffer layer is not necessarily constant but varies. Therefore, when the optimal thickness range is narrow like the Ru film, it is quite difficult to set an initial thickness of the Ru protective film so that the Ru protective film fully withstands the long-time etching and further the thickness of the Ru protective film after the etching falls within the optimal thickness range. Consequently, the reflectance tends to be lowered due to the thickness of the Ru protective film after the etching.

SUMMARY OF THE INVENTION

Therefore, it is a first object of this invention to provide a reflective mask blank and a reflective mask that have, on a multilayer reflective film, a protective film that is excellent in resistance to environment during pattern formation of an absorber layer or a buffer layer formed on the protective film and that can fully achieve an effect of preventing oxidation of the multilayer reflective film without causing a reduction in reflectance of the multilayer reflective film.

It is a second object of this invention to provide a semiconductor device manufacturing method for forming a fine pattern on a semiconductor substrate by the lithography technique using such a reflective mask.

For accomplishing the foregoing objects, this invention has the following structures.

(Structure 1) A reflective mask blank comprising a substrate, a multilayer reflective film formed on the substrate and adapted to reflect exposure light, a protective film formed on the multilayer reflective film and adapted to protect the multilayer reflective film, and an absorber layer formed on the protective film and adapted to absorb the exposure light, wherein the protective film is made of a ruthenium compound containing ruthenium (Ru) and at least one selected from the group consisting of molybdenum (Mo), niobium (Nb), zirconium (Zr), yttrium (Y), boron (B), titanium (Ti), and lanthanum (La).

According to Structure 1, since the protective film is made of the foregoing ruthenium compound, it is possible to realize a reflective mask blank having at least one of the following effects A to F.

A. A higher reflectance is obtained as compared with a Ru film or a Si film (capping layer) as an uppermost layer of a multilayer reflective film.

B. A diffusion layer is hardly formed cooperatively with the Si film as the uppermost layer of the multilayer reflective film during formation of the protective film and heat treatment thereafter (heat treatment for reducing the stress of the multilayer reflective film, prebake treatment of a resist film, cleaning, etc.). Therefore, a reduction in reflectance due to the diffusion layer does not occur.

C. Since the protective film made of the foregoing ruthenium compound has etching resistance in a dry etching condition (oxygen-containing gas) of a Cr-based buffer layer, the multilayer reflective film is not damaged. Therefore, a reduction in reflectance does not occur.

D. Since the protective film made of the foregoing ruthenium compound has etching resistance to a dry etching condition (oxygen-free gas) of a Ta-based absorber layer, the multilayer reflective film is not damaged. Therefore, a reduction in reflectance does not occur.

E. Since the optimal thickness range for achieving high reflectance is wider as compared with the Ru film or the Si film, even if there is variation in thickness reduction of the protective film due to the etching during pattern formation of the absorber layer or the Cr-based buffer layer formed on the protective film, it is easy to set an initial thickness of the protective film to be relatively thick so that the thickness of the protective film after the etching falls within the optimal thickness range and further the protective film fully withstands the etching for a long time. Therefore, it is possible to withstand the long-time etching of the Cr-based buffer layer or the absorber layer formed on the protective film, thereby preventing a reduction in reflectance.

F. Since the oxidation resistance during dry etching is higher as compared with the Ru film or the Si film, a reduction in reflectance due to formation of an oxide layer on the film surface is small. Therefore, it is possible to withstand the long-time etching under the oxygen-containing condition of the Cr-based buffer layer formed on the protective film, thereby preventing the reduction in reflectance.

(Structure 2) A reflective mask blank according to Structure 1, wherein the protective film further contains nitrogen (N).

According to Structure 2, the etching resistance is improved in the dry etching condition (oxygen-containing gas) of the Cr-based buffer layer. Further, by configuring the protective film to contain nitrogen, the film stress is reduced and adhesion to the multilayer reflective film, the absorber layer, and the buffer layer becomes excellent.

(Structure 3) A reflective mask blank according to Structure 1 or 2, further comprising a chromium-based buffer layer formed between the protective film and the absorber layer, the chromium-based buffer layer containing chromium (Cr) and having etching characteristics different from those of the absorber layer.

According to Structure 3, the multilayer reflective film is prevented from being damaged due to etching during pattern formation and pattern correction of the absorber layer. Further, since the chromium-based buffer layer can obtain high smoothness, the surface of the absorber layer formed thereon can also obtain high smoothness so that pattern blur can be reduced.

(Structure 4) A reflective mask blank according to any of Structures 1 to 3, further comprising a reflection enhancement film formed between the protective film and the absorber layer or between the protective film and the chromium-based buffer layer, the reflection enhancement film substantially made of ruthenium (Ru).

According to Structure 4, the foregoing effects A and B are exhibited to the maximum so that the optical properties (reflectance) become more excellent.

(Structure 5) A reflective mask blank according to any of Structures 1 to 4, wherein the multilayer reflective film is subjected to heat treatment.

According to Structure 5, by applying the heat treatment to the multilayer reflective film, the following effects are achieved according to its heating conditions (described later).

(a) The film stress of the multilayer reflective film is reduced so that there is obtained a reflective mask blank having high flatness. Therefore, it is possible to reduce a warp of the surface of the multilayer reflective film when formed into a reflective mask and, thus, transfer accuracy at the time of transfer onto a semiconductor substrate becomes excellent.

(b) There is obtained a reflective mask blank that can suppress age-based changes in peak wavelength (wavelength where the reflectance becomes maximum) and reflectance caused by thermal factors.

(Structure 6) A reflective mask wherein the absorber layer of the reflective mask blank according to any of Structures 1 to 5 is formed in an absorber layer pattern serving as a transfer pattern to be transferred onto a transfer target.

According to Structure 6, there is obtained a high-reflectance reflective mask with very high quality stability wherein a reduction in reflectance of the multilayer reflective film is suppressed in the reflective mask manufacturing processes.

(Structure 7) A semiconductor device manufacturing method for forming a fine pattern on a semiconductor substrate by a lithography technique using the reflective mask according to Structure 6.

By the lithography technique using the reflective mask according to Structure 6, it is possible to manufacture a semiconductor device having the fine pattern formed on the semiconductor substrate.

According to this invention, there are obtained a reflective mask blank and a reflective mask each having on a multilayer reflective film a protective film that is excellent in resistance to environment during pattern formation of an absorber layer or a buffer layer formed on the protective film and that can fully achieve the effect of preventing oxidation of the multilayer reflective film without causing a reduction in reflectance of the multilayer reflective film. Further, there is obtained a semiconductor device formed with a fine pattern on a semiconductor substrate by the lithography technique using such a reflective mask.

DESCRIPTION OF THE PREFERRED EMBODIMENTS

Now, description will be made about preferred embodiments according to this invention.

A reflective mask blank according to this invention comprises a substrate, a multilayer reflective film formed on the substrate and adapted to reflect exposure light, a protective film formed on the multilayer reflective film and adapted to protect the multilayer reflective film, and an absorber layer formed on the protective film and adapted to absorb the exposure light. Specifically, the protective film is made of a ruthenium compound containing ruthenium (Ru) and at least one selected from the group consisting of molybdenum (Mo), niobium (Nb), zirconium (Zr), yttrium (Y), boron (B), titanium (Ti), and lanthanum (La).

Reflective mask blanks of this invention can be classified into the following three embodiments featured by materials of the respective protective films.

First Embodiment

The protective film according to the first embodiment is specified by a material formed by a ruthenium compound that contains ruthenium (Ru) and an element that may be either molybdenum (Mo) or niobium (Nb).

As typical materials included in the protective film according to the first embodiment, $Mo_{63}Ru_{37}$ and NbRu are exemplified.

By comprising the protective film of the first embodiment, there is obtained a reflective mask blank having the following six effects A to F.

A. A higher reflectance is obtained as compared with a Ru film or a Si film (capping layer) as an uppermost layer of a multilayer reflective film.

B. During formation of the protective film, a diffusion layer is hardly formed between the protective film and the Si film placed as the uppermost layer of the multilayer reflective film. Such diffusion might be caused to occur during heat treatment after formation of the protective film (heat treatment for reducing the stress of the multilayer reflective film, prebake treatment of a resist film, cleaning, etc.). Therefore, a reduction in reflectance due to the formation of the diffusion layer can be avoided.

C. Since the protective film of the foregoing ruthenium compound has etching resistance in a dry etching condition (oxygen-containing gas) of a Cr-based buffer layer, the multilayer reflective film is not damaged. Therefore, a reduction in reflectance does not occur.

D. Since the protective film made of the foregoing ruthenium compound has etching resistance to a dry etching condition (oxygen-free gas) of a Ta-based absorber layer, the multilayer reflective film is not damaged. Therefore, a reduction in reflectance does not occur.

E. The protective film mentioned above has the optimal thickness range of achieving high reflectance that is wider than the Ru film or the Si film, even if a reduction of the protective film is varied in thickness due to the etching during pattern formation of the absorber layer or the Cr-based buffer layer formed on the protective film. Accordingly, an initial thickness of the protective film may be relatively thick so that the thickness of the protective film after the etching falls within the optimal thickness range and further the protective film fully withstands the etching for a long time. Thus, it is possible to withstand the long-time etching of the Cr-based buffer layer or the absorber layer formed on the protective film. This serves to prevent a reduction in reflectance.

F. Since the protective film has a high oxidation resistance during dry etching as compared with the Ru film or the Si film, a reduction in reflectance can be suppressed due to formation of an oxide layer on the film surface. Therefore, it is possible to withstand the long-time etching under the oxygen-containing condition of the Cr-based buffer layer formed on the protective film. This structure serves to prevent the reduction in reflectance.

Second Embodiment

The protective film according to the second embodiment of this invention is featured by a ruthenium compound that contains ruthenium (Ru) and an element that is either zirconium (Zr) or yttrium (Y).

As typical materials included in the protective film according to the second embodiment, ZrRu, $Ru_2Y$, and $Ru_{25}Y_{44}$ can be exemplified.

By comprising the protective film of the second embodiment, there is obtained a reflective mask blank having the following five effects B to F.

B. During formation of the protective film, a diffusion layer is hardly formed between the protective film and the Si film placed as the uppermost layer of the multilayer reflective film. Such diffusion might be caused to occur during heat treatment after formation of the protective film (heat treatment for reducing the stress of the multilayer reflective film, prebake treatment of a resist film, cleaning, etc). Therefore, a reduction in reflectance due to the formation of the diffusion layer can be avoided.

C. Since the protective film made of the foregoing ruthenium compound has etching resistance in a dry etching condition (oxygen-containing gas) of a Cr-based buffer layer, the multilayer reflective film is not damaged. Therefore, a reduction in reflectance does not occur.

D. Since the protective film made of the foregoing ruthenium compound has etching resistance to a dry etching condition (oxygen-free gas) of a Ta-based absorber layer, the multilayer reflective film is not damaged. Therefore, a reduction in reflectance does not occur.

E. The protective film mentioned above has the optimal thickness range of achieving high reflectance that is wider than the Ru film or the Si film, even if a reduction of the protective film is varied in thickness due to the etching during pattern formation of the absorber layer or the Cr-based buffer layer formed on the protective film. Accordingly, an initial thickness of the protective film may be relatively thick so that the thickness of the protective film after the etching falls within the optimal thickness range and further the protective film fully withstands the etching for a long time. Thus, it is possible to withstand the long-time etching of the Cr-based buffer layer or the absorber layer formed on the protective film. This serves to prevent a reduction in reflectance.

F. Since the protective film has a high oxidation resistance during dry etching as compared with the Ru film or the Si film, a reduction in reflectance can be suppressed due to formation of an oxide layer on the film surface. Therefore, it is possible to withstand the long-time etching under the oxygen-containing condition of the Cr-based buffer layer formed on the protective film. This structure serves to prevent the reduction in reflectance.

Third Embodiment

The protective film according to the third embodiment is featured by a ruthenium compound containing ruthenium (Ru) and an element selected from boron (B), titanium (Ti), and lanthanum (La).

As typical materials included in the protective film according to the third embodiment, $Ru_7B_3$, $RuB$, $Ru_2B_3$, $RuB_2$, $TiRu$, and $LaRu_2$ can be exemplified.

By comprising the protective film of the third embodiment, there is obtained a reflective mask blank having the following four effects B, C, D, and F.

B. During formation of the protective film, a diffusion layer is hardly formed between the protective film and the Si film placed as the uppermost layer of the multilayer reflective film. Such diffusion might be caused to occur during heat treatment after formation of the protective film (heat treatment for reducing the stress of the multilayer reflective film, prebake treatment of a resist film, cleaning, etc.). Therefore, a reduction in reflectance due to the formation of the diffusion layer can be avoided.

C. Since the protective film made of the foregoing ruthenium compound has etching resistance in a dry etching condition (oxygen-containing gas) of a Cr-based buffer layer, the multilayer reflective film is not damaged. Therefore, a reduction in reflectance does not occur.

D. Since the protective film made of the foregoing ruthenium compound has etching resistance to a dry etching condition (oxygen-free gas) of a Ta-based absorber layer, the multilayer reflective film is not damaged. Therefore, a reduction in reflectance does not occur.

F. Since the protective film has a high oxidation resistance during dry etching as compared with the Ru film or the Si film, a reduction in reflectance can be suppressed due to formation of an oxide layer on the film surface. Therefore, it is possible to withstand the long-time etching under the oxygen-containing condition of the Cr-based buffer layer formed on the protective film. This structure serves to prevent the reduction in reflectance.

The Ru content in the ruthenium compound in each of the first to third embodiments is preferably set to 10 to 95 at % for achieving the foregoing effects to the maximum. Particularly, in order to enhance the foregoing effects A and B (improve the reflectance), the Ru content in the ruthenium compound is preferably set to 30 to 95 at %. More preferably, a reflection enhancement film substantially made of ruthenium (Ru) is formed between the protective film made of the foregoing ruthenium compound and the absorber layer. Herein, "substantially made of ruthenium (Ru)" naturally includes a case of ruthenium (Ru) alone and further includes a case where an oxide layer is formed as an extreme surface layer of the reflection enhancement film or a case where impurities are slightly contained in the reflection enhancement film. In this case, in terms of improving the reflectance, the thickness of the reflection enhancement film is preferably selected in the range of 2.0 to 8.0 nm.

Further, in each of the first to third embodiments, the thickness of the protective film is preferably selected in the range of 0.5 to 5 nm. More preferably, the thickness of the protective film is set to a value that makes maximum the reflectance of light reflected on the multilayer reflective film.

In order to further improve the foregoing effect C (the etching resistance in the dry etching condition (oxygen-containing gas) of the Cr-based buffer layer is improved), nitrogen (N) is preferably contained in the protective film. By configuring the protective film to contain nitrogen, the film stress is reduced and adhesion to the multilayer reflective film, the absorber layer, and the buffer layer becomes excellent. The content of nitrogen is preferably 2 to 30 at % and more preferably 5 to 15 at %.

Further, carbon (C) or oxygen (O) can be contained in the protective film within the range not deviating from the effects of this invention. By configuring the protective film to contain carbon, the chemical resistance is improved. On the other hand, by configuring the protective film to contain oxygen, it is possible to further improve the foregoing effect F (the etching resistance under the oxygen-containing condition is improved).

In each of the first to third embodiments, the description has been made about the case where the material of the protective film is the ruthenium compound containing ruthenium (Ru) and one element selected from molybdenum (Mo), niobium (Nb), zirconium (Zr), yttrium (Y), boron (B), titanium (Ti), and lanthanum (La). However, this invention is not limited thereto. The material of the protective film may be a ruthenium compound containing ruthenium (Ru) and two or more elements selected from molybdenum (Mo), niobium (Nb), zirconium (Zr), yttrium (Y), boron (B), titanium (Ti), and lanthanum (La). As specific examples of such ruthenium compounds, there can be cited $YRuB_2$, $(MoRu)_3B_4$, $B_6Nb_{3.1}Ru_{19.9}$, and so on.

The protective film does not necessarily have a uniform composition over its entirety and, for example, may have a gradient composition so that the composition changes in a thickness direction of the protective film. In the gradient composition, the composition of contained elements may change continuously or stepwise.

A preferred embodiment according to this invention also resides in applying heat treatment to the multilayer reflective film. By applying the heat treatment to the multilayer reflective film, the following effects are achieved according to its heating conditions.

(a) The film stress of the multilayer reflective film is reduced so that there is obtained a reflective mask blank having high flatness. Therefore, it is possible to reduce a warp of the surface of the multilayer reflective film when a reflective mask is fabricated and, thus, transfer accuracy at the time of transfer onto a semiconductor substrate becomes excellent.

(b) There is obtained a reflective mask blank that can suppress age-based changes in a peak wavelength (wavelength where the reflectance becomes maximum) and a reflectance. Such changes might thermally occur.

In the heat treatment applied to the multilayer reflective film, the heating temperature is preferably 50° C. or more. For achieving the effect (a), the heating temperature is preferably 50° C. or more and 150° C. or less. On the other hand, for achieving the effect (b), the heating temperature is preferably 50° C. or more and 100° C. or less.

A chromium-based buffer layer may be formed between the protective film and the absorber layer. In this event, the chromium-based buffer layer may contain chromium (Cr) and may have etching characteristics different from those of the absorber layer. By forming the buffer layer, the multilayer reflective film is prevented from being damaged due to etching during pattern formation and pattern correction of the absorber layer. Further, since the chromium-based buffer layer can obtain high smoothness, the surface of the absorber layer formed thereon can also obtain high smoothness so that pattern blur can be reduced.

As a material of the chromium-based buffer layer, use can be made of a material containing chromium (Cr) alone or a material containing chromium (Cr) and at least one element selected from nitrogen (N), oxygen (O), carbon (C), and fluorine (F). For example, the smoothness becomes excellent by containing nitrogen, the etching resistance under the dry etching conditions of the absorber layer is improved by containing carbon, and the film stress can be reduced by containing oxygen. Specifically, there can be cited materials such as CrN, CrO, CrC, CrF, CrON, CrCO, and CrCON.

Each of the foregoing reflective mask blanks may include a resist film that is attached to the absorber layer and that serves to form a predetermined transfer pattern.

The reflective mask blanks mentioned above are helpful to form reflective masks which may be classified as follows.

(1) A reflective mask having a multilayer reflective film on a substrate, a protective film and a buffer layer on the multilayer reflective film, and an absorber layer pattern that is formed on the buffer layer and that has a predetermined transfer pattern. In other words, the reflective mask of this type with the buffer layer is specified by the patterned absorber layer.

(2) A reflective mask having a multilayer reflective film on a substrate, a protective film on the multilayer reflective film, and a buffer layer and an absorber layer which are successively formed on the protective film and both of which have a predetermined transfer pattern. Simply, the reflective mask of this type is featured by the patterned buffer and the absorber layers.

(3) A reflective mask having a multilayer reflective film on a substrate, a protective film, and an absorber layer which is formed on the protective film and which has a predetermined transfer pattern. The reflective mask without any buffer layer is featured by the patterned absorber layer.

FIGS. 1A to 1D are schematic sectional views showing one embodiment of a reflective mask blank according to this invention and processes or steps of manufacturing a reflective mask by the use of this mask blank.

Figure 1A:
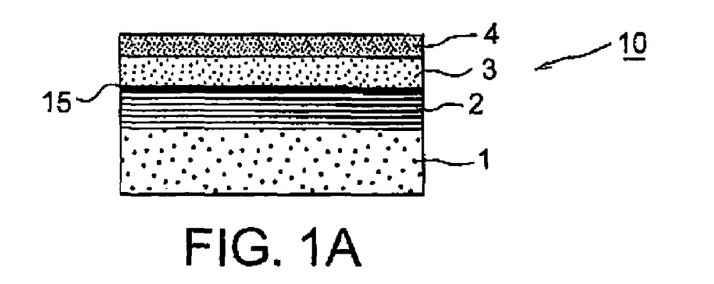
FIGS. 1A to 1D are sectional views showing a structure of one embodiment of a reflective mask blank and processes of manufacturing a reflective mask by the use of this mask blank.

As shown in FIG. 1A, the reflective mask blank according to this embodiment is structured by a substrate 1, a multilayer reflective film 2 on the substrate 1, a protective film 15 on the multilayer reflective film 2, a buffer layer 3, and an absorber layer 4. The buffer layer 3 and the absorber layer 4 are successively formed on the protective film 15.

In order to prevent pattern deformation due to heat during exposure, the substrate 1 preferably has a low thermal expansion coefficient in the range of $0 \pm 1.0 \times 10^{-7}/°$ C. and more preferably in the range of $0 \pm 0.3 \times 10^{-7}/°$ C. As a material having the low thermal expansion coefficient in such a range, use can be made of any of an amorphous glass, a ceramic, and a metal. For example, use can be made of a $SiO_2$—$TiO_2$-based glass or a quartz glass in the case of an amorphous glass or, in the case of a crystallized glass, a crystallized glass precipitated with β-quartz solid solution. As an example of a metal substrate, an Invar alloy (Fe—Ni-based alloy) or the like can be cited. It is also possible to use a single-crystal silicon substrate.

Further, in order to obtain high reflectance and high transfer accuracy, the substrate 1 preferably has high smoothness and high flatness. Particularly, the substrate 1 preferably has a smooth surface of 0.2 nmRms or less (smoothness in 10 μm square area) and a flatness of 100 nm or less (flatness in 142 mm square area). Further, the substrate 1 preferably has high rigidity in order to prevent deformation of the substrate 1 due to film stress of the film formed thereon. Particularly, the substrate 1 preferably has a high Young's modulus of 65 GPa or more.

The unit Rms showing the smoothness represents the root mean square roughness and can be measured by an atomic force microscope. On the other hand, the flatness is represented by a value indicative of surface warp (deformation) given by TIR (total indicated reading). This is an absolute value of a difference between the highest position of the surface of the substrate located above a focal plane, given as a plane determined by the method of least squares on the basis of the surface of the substrate, and the lowest position of the surface of the substrate located below the focal plane.

As described before, the multilayer reflective film 2 is formed by a multiple of films that are composed of elements having different refractive indices and that are repeatedly laminated. In general, the multiple of the films are formed by thin films of a heavy element or its compound and thin films of a light element or its compound and are alternately stacked by about 40 to 60 times or sets. This shows that the heavy element film and the light element film are stacked in the form of a unit or a set.

For example, as a multilayer reflective film for EUV light having a wavelength of 13 to 14 nm, use is preferably made of the foregoing Mo/Si set multilayer film in which Mo films and Si films are alternately layered by about 40 times or sets. As other multilayer reflective films for use in the region of the EUV light, there are cited a Ru/Si set multilayer film, a Mo/Be set multilayer film, a Mo compound/Si compound set multilayer film, a Si/Nb set multilayer film, a Si/Mo/Ru set multilayer film, a Si/Mo/Ru/Mo set multilayer film, a Si/Ru/Mo/Ru set multilayer film, and so on. The material may be properly selected according to the exposure wavelength.

The multilayer reflective film 2 can be formed by depositing each layer according to a DC magnetron sputtering method, an ion beam sputtering method, or the like. In the case of the foregoing Mo/Si set multilayer film, using, for example, the ion beam sputtering method, a Si target is first used to deposit a Si film to a thickness of about several nm, then a Mo target is used to deposit a Mo film to a thickness of about several nm. Thus, a set of the above-mentioned Si film and Mo film is deposited as a single set of the Si film and the Mo film and repeatedly deposited by 40 to 60 times or sets. After deposition of the multilayer reflective film 2, the protective film 15 made of the material of this invention is formed on the multilayer reflective film 2 so as to protect the multilayer reflective film 2 from being etched.

The buffer layer 3 on the protective film 15 may be preferably formed by the foregoing chromium-based buffer layer.

The buffer layer 3 can be formed by a sputtering method such as ion beam sputtering other than DC sputtering or RF sputtering.

Considering correction of the absorber layer pattern by the use of a focused ion beam (FIB), the thickness of the buffer layer 3 is preferably set to about 20 to 60 nm, but, when the FIB is not used, may be set to about 5 to 15 nm.

The absorber layer 4 has a function of absorbing the exposure light, for example, the EUV light and can be preferably made of tantalum (Ta) alone or a material containing Ta as a main component. The material containing Ta as the main component is normally an alloy of Ta. In terms of smoothness and flatness, the absorber layer preferably has an amorphous or crystallite structure.

As the material containing Ta as the main component, use can be made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like. By adding B, Si, Ge, or the like to Ta, the amorphous material can be easily obtained to improve the smoothness. On the other hand, adding N or O to Ta may improve the resistance to oxidation and the aging stability.

Among others, there can be most cited, for example, the material containing Ta and B (composition ratio Ta/B is in the range of 8.5/1.5 to 7.5/2.5) or the material containing Ta, B, and N (when N is 5 to 30 at % and the balance is given as 100, B is 10 to 30 at %). In the case of such a material, the crystallite or amorphous structure can be easily obtained so that excellent smoothness and flatness can be achieved.

Such an absorber layer made of Ta alone or Ta as the main component is preferably formed by the sputtering method such as magnetron sputtering. For example, in the case of the TaBN film, it can be formed by the sputtering method using a target containing tantalum and boron and using an argon gas added with nitrogen. In the case of the film formation by the sputtering method, the internal stress can be controlled by changing the power and the introducing gas pressure applied to the sputtering target. Further, since the film formation is enabled at low temperature such as about room temperature, the thermal influence to the multilayer reflective film and so on can be reduced.

Other than the material containing Ta as the main component, there can be cited, for example, materials such as WN, TiN, and Ti.

The absorber layer 4 may have a layered or stacked structure composed of a plurality of layers.

The absorber layer 4 should have a thickness that can sufficiently absorb the exposure light, for example, the EUV light and that may be normally about 30 to 100 nm.

In the embodiment shown in FIG. 1A, the reflective mask blank 10 is configured in the above-mentioned manner and especially has the buffer layer 3. However, the buffer layer 3 may be omitted, depending on a process of forming a pattern of the absorber layer 4 or a process of correcting the formed pattern.

Now, description will be made about the processes of manufacturing a reflective mask by the use of the reflective mask blank 10.

In this event, the materials and forming methods of the respective layers of the reflective mask blank 10 (see FIG. 1A) are similar to those mentioned above.

Then, the absorber layer 4 of the reflective mask blank 10 is patterned to have a predetermined transfer pattern. At first, an electron-beam resist is coated on the absorber layer 4 and subjected to baking. Then, the resist is subjected to pattern writing by the use of an electron-beam writing apparatus and development, thereby forming a predetermined resist pattern 5a.

Figure 1B:
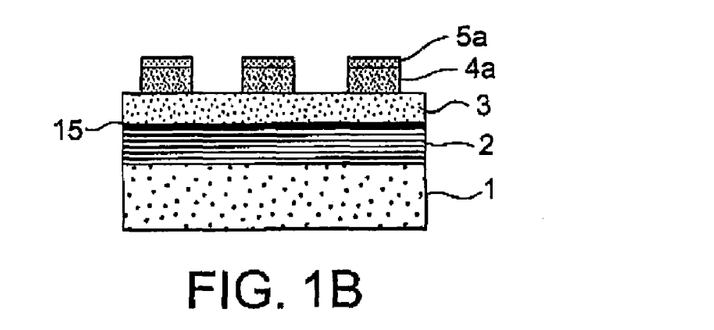

Then, by using the formed resist pattern 5a as a mask, the absorber layer 4 is dry-etched to thereby form an absorber layer pattern 4a in the shape of the predetermined transfer pattern (see FIG. 1B). In the case of the absorber layer 4 being made of a material containing Ta as a main component, it is possible to apply dry etching by using a chlorine gas.

Figure 1C:
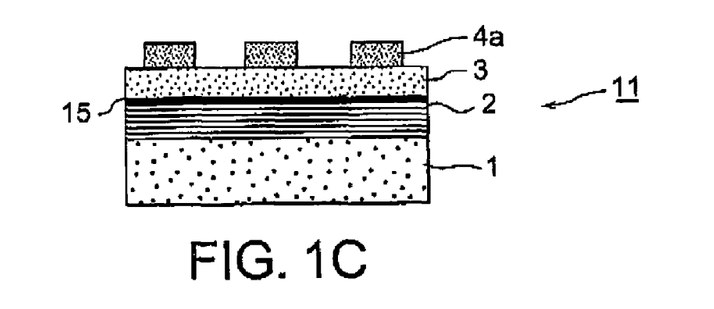

Then, the resist pattern 5a remaining on the absorber layer pattern 4a is removed by the use of heated concentrated sulfuric acid, thereby obtaining a mask 11 (see FIG. 1C).

Normally, an inspection is carried out at this stage to check whether or not the absorber layer pattern 4a is formed according to a design. In the inspection of the absorber layer pattern 4a, use is made of, for example, DUV (deep ultraviolet) light having a wavelength of about 190 nm to 260 nm and this inspection light is incident on the mask 11 formed with the absorber layer pattern 4a. Herein, the inspection is carried out by detecting inspection light reflected on the absorber layer pattern 4a and inspection light reflected on the buffer layer 3 exposed by the removal of the absorber layer 4 to thereby observe a contrast therebetween.

In this manner, detection is made of, for example, a pinhole defect (white defect) formed by removal of the absorber layer at a portion that should not be removed by etching and an etching insufficient defect (black defect) where the absorbent layer is not sufficiently removed due to insufficient etching. When such a pinhole defect or an etching insufficient defect is detected, correction thereof is carried out.

For correcting the pinhole defect, there is, for example, a method of depositing a carbon film in a pinhole according to the FIB assist deposition method. On the other hand, for correcting the etching insufficient defect, there is, for example, a method of removing an unnecessary portion by FIB irradiation. In this event, the buffer layer 3 serves as a protection layer for protecting the multilayer reflective film 2 against the FIB irradiation.

Figure 1D:
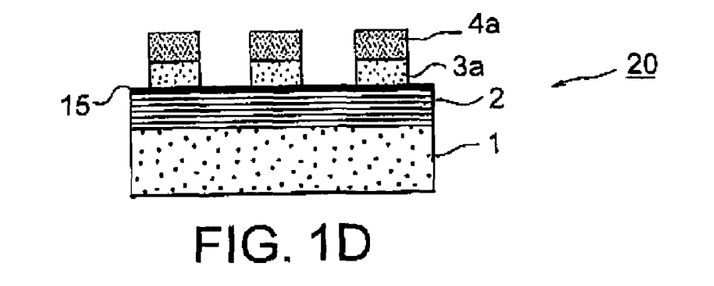

After the pattern inspection and correction have been finished, the exposed buffer layer 3 is removed after formation of the absorber layer pattern 4a and is patterned into a buffer layer pattern 3a. Thus, a reflective mask 20 is obtained as shown in FIG. 1D. Herein, for example, in the case of the buffer layer made of the Cr-based material, dry etching can be carried out by using a mixed gas containing chlorine and oxygen. Although the multilayer reflective film 2 is directly exposed and serves as a reflection area for the exposure light at a portion where the buffer layer is removed, the protective film 15 of the protective film material according to this invention is formed on the exposed multilayer reflective film 2. In this event, the protective film 15 protects the multilayer reflective film 2 from being etched on the dry etching of the buffer layer 3.

When the required reflectance is ensured without removing the buffer layer 3, the buffer layer 3 may be left on the multilayer reflective film 2 having the protective film thereon, without processing the buffer layer 3 into the pattern 3a after formation of the absorber layer pattern 4a.

Lastly, an inspection is carried out to finally confirm whether or not the absorber layer pattern 4a is formed with dimensional accuracy designated by a specification. Also in this inspection for final confirmation, the foregoing DUV light is used.

The reflective mask manufactured by this invention is particularly suitable for the case where the EUV light (wavelength: about 0.2 to 100 nm) is used as the exposure light, but is also applicable to light having another wavelength.

Hereinbelow, the embodiments of this invention will be described in further detail in terms of Examples.

The following Examples 1 to 4 relate to the foregoing first embodiment.

Example 1

A $SiO_2$—$TiO_2$-based glass substrate (6-inch square; thickness: 6.3 mm) was prepared in advance. This glass substrate had a thermal expansion coefficient of $0.2 \times 10^{-7}/°$ C. and a Young's modulus of 67 GPa. The glass substrate had a smooth surface of 0.2 nmRms or less and a flatness of 100 nm or less by mechanical polishing.

As a multilayer reflective film formed on the substrate, a Mo film/Si film-set multilayer reflective film was adopted so as to obtain a multilayer reflective film suitable for an exposure wavelength band of 13 to 14 nm. That is, the multilayer reflective film was formed by using a Mo target and a Si target and alternately stacking Mo films and Si films on the substrate by ion beam sputtering. At first, a Si film was deposited to a thickness of 4.2 nm by the use of the Si target, then a Mo film was deposited to a thickness of 2.8 nm by the use of the Mo target. Both of the Si and the Mo films were formed as a single set and forty sets were successively layered or stacked. Thereafter, a Si film was deposited to a thickness of 4.2 nm, and finally, a $Mo_{63}Ru_{37}$ film was deposited to a thickness of 2.3 nm as a protective film by the use of a $Mo_{63}Ru_{37}$ target, thereby obtaining a multilayer reflective film coated substrate. Reflectance was measured by applying EUV light of 13.5 nm to the multilayer reflective film at an incident angle of 6.0 degrees and it was 66.1%. Further, the surface roughness of the multilayer reflective film was 0.13 nmRms.

Figure 4:
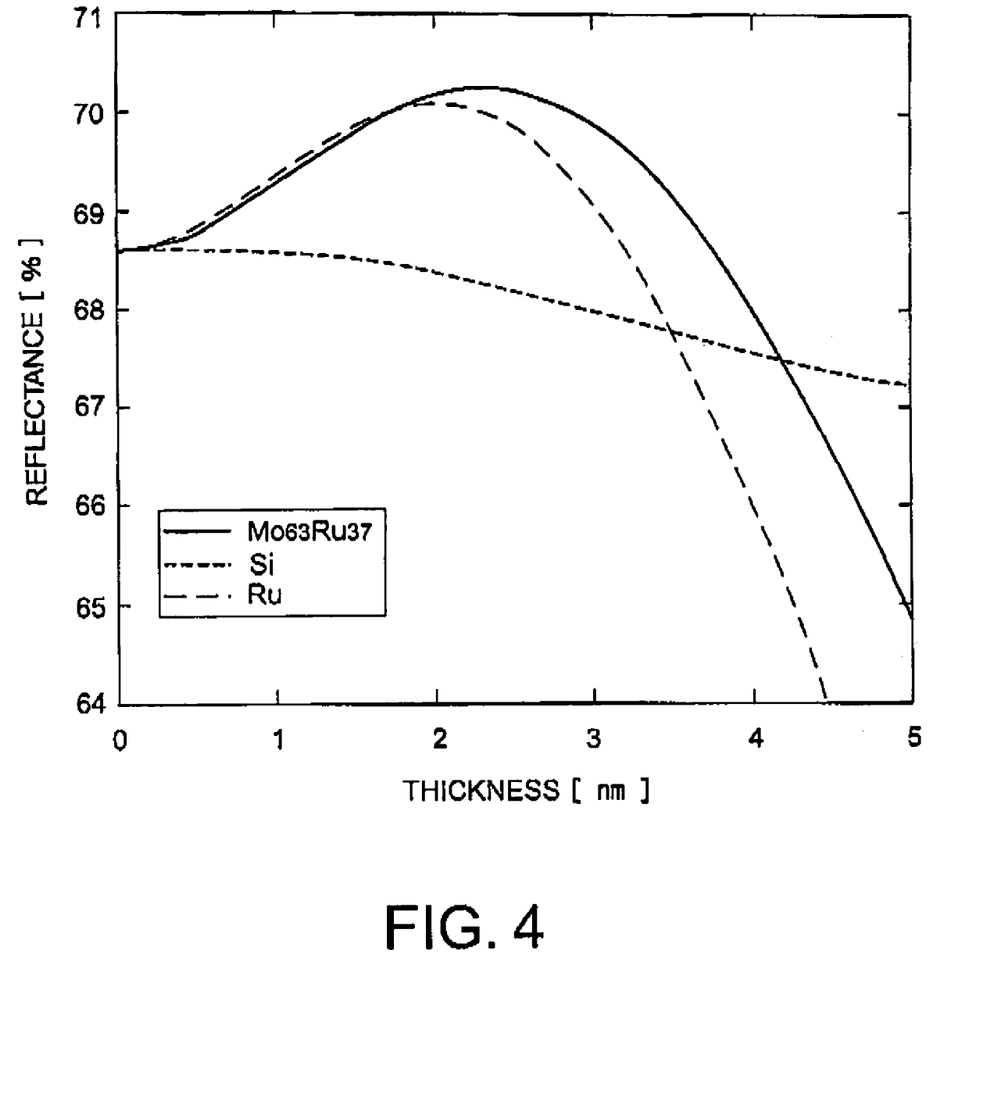
FIG. 4 is a diagram showing the film thickness dependency of reflectance when use was made of a $Mo_{63}Ru_{37}$ protective film of Example 1.

FIG. 4 shows the film thickness dependency of reflectance when $Mo_{63}Ru_{37}$ was used as the material of the protective film. For comparison, FIG. 4 also shows the film thickness dependency of reflectance when Ru was used as a material of the protective film 15. The film thickness dependency of reflectance shown in FIG. 4 represents values calculated by an optical simulator and there is a case where the actual reflectance is reduced by 3 to 4% due to diffusion layers formed at interfaces between the Mo and Si layers, impurities contained in the Mo and Si layers, and so on. However, the relative relationship about reflectance magnitudes of the respective materials shown in FIG. 4 does not change. By taking a measure to minimize the foregoing diffusion layers and impurities, the actual reflectance can be made approximate to the reflectance values shown in FIG. 4. As shown in FIG. 4, higher reflectance can be achieved with a thickness of 1.7 nm or more as compared with the Ru film and a maximum reflectance of 70.2% can be achieved as a theoretical value with a thickness of 2.3 nm. Further, since the thickness range of high reflectance is wider than the Ru film, it is possible to set a thickness that can withstand long-time etching of a Cr-based buffer layer or an absorber layer formed on the protective film so that etching damage to the multilayer reflective film can be prevented. The thickness of the $Mo_{63}Ru_{37}$ film in this Example was set to the value where the reflectance becomes maximum.

For the purpose of reducing the film stress of the multilayer reflective film, the foregoing multilayer reflective film coated substrate was placed on a hot plate and subjected to heat treatment at a heating temperature of 100° C. for 15 minutes. An interface between the uppermost Si film of the multilayer reflective film and the $Mo_{63}Ru_{37}$ film was observed by a transmission electron microscope, but a diffusion layer where Si and $Mo_{63}Ru_{37}$ were mixed was not confirmed. Further, this multilayer reflective film coated substrate was left in the atmosphere for 100 days, but there was no change in reflectance.

Then, a buffer layer was formed on the protective film of the substrate with the multilayer reflective film mentioned above. As the buffer layer, a chromium nitride film was deposited to a thickness of 20 nm. The buffer layer was formed by the DC magnetron sputtering method by using a Cr target and using a mixed gas of argon (Ar) and nitrogen ($N_2$) as a sputtering gas. In the formed CrNx film, nitrogen (N) was 10 at % (x=0.1).

Then, on the buffer layer, a material containing Ta, B, and N was deposited to a thickness of 80 nm as an absorber layer. That is, the absorber layer was formed by the DC magnetron sputtering method using a target containing Ta and B and adding nitrogen ($N_2$) in an amount of 10% to argon (Ar). Thus, a reflective mask blank of this Example was obtained. The composition ratio of the formed TaBN film was such that Ta was 0.8 at %, B was 0.1 at %, and N was 0.1 at %.

Then, by the use of this reflective mask blank, an EUV exposure reflective mask having a 16 Gbit-DRAM pattern on a 0.07 μm design rule was fabricated in the following manner.

At first, an electron-beam writing resist was coated on the reflective mask blank and a resist pattern was formed by electron-beam writing and development.

Then, using this resist pattern as a mask, dry etching was applied to the absorber layer by the use of a chlorine gas, thereby forming the absorber layer into a transfer pattern.

Then, using the absorber layer pattern as a mask, dry etching was applied to the buffer layer by the use of a mixed gas of chlorine and oxygen so as to remove the buffer layer remaining in a reflection area (portion with no absorber layer pattern), thereby exposing the multilayer reflective film to obtain the reflective mask. In the case of the $Mo_{63}Ru_{37}$ protective film, the etching selectivity between the buffer layer and the protective film was 12:1.

A final confirmation inspection of the obtained reflective mask was carried out and it was confirmed that the 16 Gbit-DRAM pattern on the 0.07 μm design rule was formed according to a design. Further, the reflectance of the EUV light in the reflection area hardly changed as compared with the reflectance measured in the form of the multilayer reflective film coated substrate and it was 66.0%.

Figure 2:
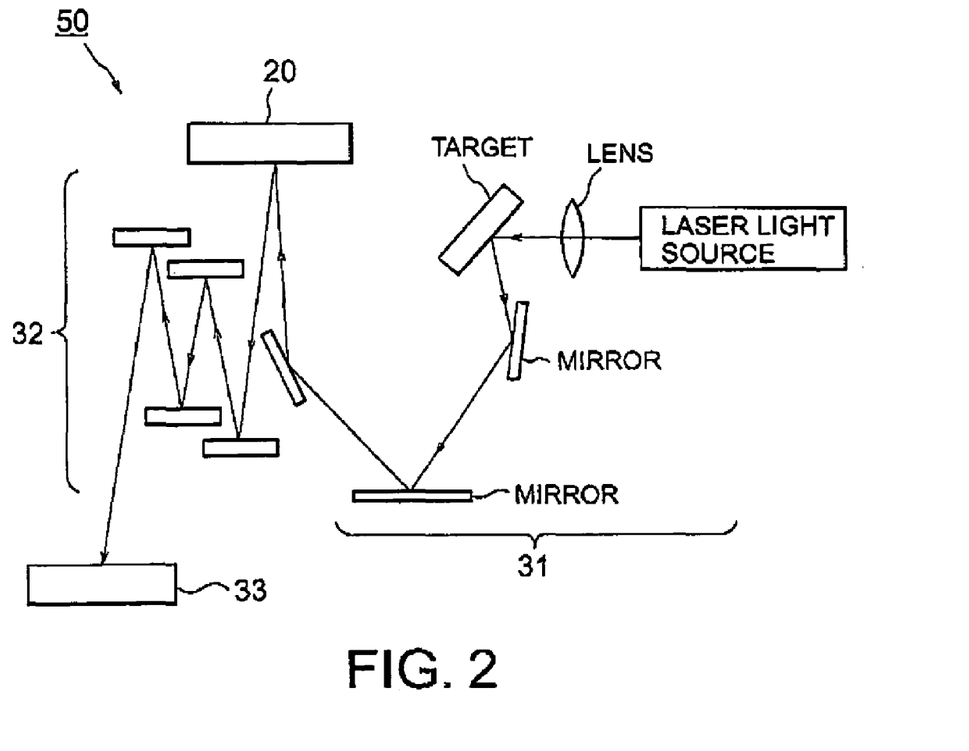
FIG. 2 is a diagram showing a schematic structure of a pattern transfer apparatus with a reflective mask disposed therein.

Then, using the obtained reflective mask of this Example, exposure transfer onto a semiconductor substrate was carried out with EUV light by the use of a pattern transfer apparatus 50 as shown in FIG. 2.

The pattern transfer apparatus 50 with a reflective mask 20 disposed therein is roughly formed by a laser plasma X-ray source 31, a reduction optical system 32, and so on. The reduction optical system 32 uses X-ray reflecting mirrors. A pattern reflected from the reflective mask 20 is normally reduced in size to about a quarter through the reduction optical system 32. A very short wavelength band, such as 13 to 14 nm, was used as an exposure wavelength. Taking this into account, an optical path was located in a vacuum in advance.

In this state, the EUV light obtained from the laser plasma X-ray source 31 was incident on the reflective mask 20 and the light reflected therefrom was transferred onto a silicon wafer (resist-coated semiconductor substrate) 33 through the reduction optical system 32.

The light incident on the reflective mask 20 is absorbed by the absorber layer and thus is not reflected at a portion where the absorber layer pattern 4*a* (see FIG. 1D) is present. On the other hand, reflection takes place by the multilayer reflective film at a portion where the absorber layer pattern 4*a* is not present. In this manner, an image formed by the light reflected from the reflective mask 20 enters the reduction optical system 32. The exposure light through the reduction optical system 32 exposes a transfer pattern onto a resist layer of the silicon wafer 33. Then, by developing the exposed resist layer, a resist pattern is formed on the silicon wafer 33.

The pattern transfer onto the semiconductor substrate was carried out in a manner as described above and it was confirmed that the accuracy of the reflective mask of this Example was 16 nm or less being a required accuracy of the 70 nm design rule.

Example 2

A multilayer reflective film coated substrate was fabricated in the same manner as in Example 1 except that the thickness of a protective film made of $Mo_{63}Ru_{37}$ was set to 0.4 nm and a reflection enhancement film made of Ru was further formed to a thickness of 3.5 nm on the surface of the protective film. Reflectance was measured by applying EUV light of 13.5 nm to the multilayer reflective film at an incident angle of 6.0 degrees, resulting in a high reflectance of 66.6%, i.e. increased by 0.5% as compared with Example 1.

Like in Example 1, for the purpose of reducing the film stress of the multilayer reflective film, the multilayer reflective film coated substrate was subjected to heat treatment at a heating temperature of 100° C. for 15 minutes. An interface between the uppermost Si film of the multilayer reflective film and the $Mo_{63}Ru_{37}$ film was observed by the transmission electron microscope, but a diffusion layer where Si and $Mo_{63}Ru_{37}$ were mixed was not confirmed. Further, this multilayer reflective film coated substrate was left in the atmosphere for 100 days, but there was no change in reflectance.

Then, like in Example 1, a buffer layer and an absorber layer were formed on the reflection enhancement film made of Ru, thereby obtaining a reflective mask blank and then a reflective mask. The reflectance of the EUV light in a reflection area of the obtained reflective mask hardly changed as compared with the reflectance measured in the form of the multilayer reflective film coated substrate and a high reflectance of 66.5% was maintained.

Further, pattern transfer onto a semiconductor substrate was carried out by the use of the apparatus shown in FIG. 2 and it was confirmed that the accuracy of the reflective mask of this Example was 16 nm or less being the required accuracy of the 70 nm design rule.

Example 3

A multilayer reflective film coated substrate was fabricated in the same manner as in Example 1 except that a material of a protective film was changed to NbRu. The NbRu protective film was deposited to a thickness of 2.3 nm by the ion beam sputtering method using a NbRu target. Reflectance was measured by applying EUV light of 13.5 nm to the multilayer reflective film at an incident angle of 6.0 degrees and it was 66.1%.

Figure 5:
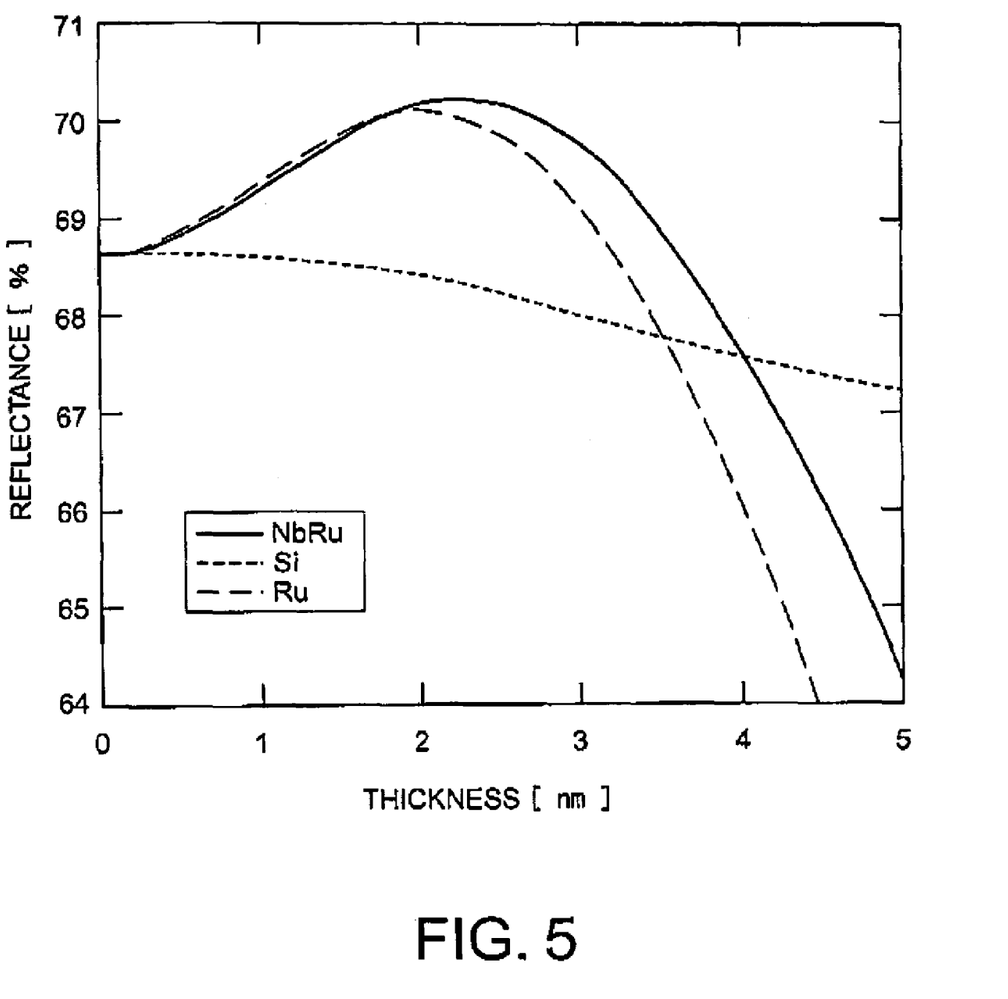
FIG. 5 is a diagram showing the film thickness dependency of reflectance when use was made of a NbRu protective film of Example 3.

FIG. 5 shows the film thickness dependency of reflectance when NbRu was used as the material of the protective film. For comparison, FIG. 5 also shows the film thickness dependency of reflectance when Ru was used as a material of a protective film. The film thickness dependency of reflectance shown in FIG. 5 represents values calculated by an optical simulator and there is a case where the actual reflectance is reduced by 3 to 4% due to diffusion layers formed at interfaces between the Mo and Si layers, impurities contained in the Mo and Si layers, and so on. However, the relative relationship about reflectance magnitudes of the respective materials shown in FIG. 5 does not change. By taking a measure to minimize the foregoing diffusion layers and impurities, the actual reflectance can be made approximate to the reflectance values shown in FIG. 5. As shown in FIG. 5, higher reflectance can be achieved with a thickness of 1.7 nm or more as compared with the Ru film and a maximum reflectance of 70.2% can be achieved as a theoretical value with a thickness of 2.3 nm. Further, since the thickness range of high reflectance is wider than the Ru film, it is possible to set a thickness that can withstand long-time etching of a Cr-based buffer layer or an absorber layer formed on the protective film so that etching damage to the multilayer reflective film can be prevented. The thickness of the NbRu film in this Example was set to the value where the reflectance becomes maximum.

For the purpose of reducing the film stress of the multilayer reflective film, the multilayer reflective film coated substrate was placed on a hot plate and subjected to heat treatment at a heating temperature of 100° C. for 15 minutes. An interface between the uppermost Si film of the multilayer reflective film and the NbRu film was observed by the transmission electron microscope, but a diffusion layer where Si and NbRu were mixed was not confirmed. Further, this multilayer reflective film coated substrate was left in the atmosphere for 100 days, but there was no change in reflectance.

Then, by the use of the multilayer reflective film coated substrate, a reflective mask blank and then a reflective mask were fabricated like in Example 1. In the case of the NbRu protective film, the etching selectivity between the buffer layer and the protective film was 15:1. The reflectance of the EUV light in a reflection area of the reflective mask was 66.0%.

Further, pattern transfer onto a semiconductor substrate was carried out by the use of the apparatus shown in FIG. 2 and it was confirmed that the accuracy of the reflective mask of this Example was 16 nm or less being the required accuracy of the 70 nm design rule.

Example 4

A multilayer reflective film coated substrate was fabricated in the same manner as in Example 3 except that the thickness of a protective film made of NbRu was set to 0.4 nm and a reflection enhancement film made of Ru was further formed to a thickness of 3.5 nm on the surface of the protective film. Reflectance was measured by applying EUV light of 13.5 nm to the multilayer reflective film at an incident angle of 6.0 degrees, resulting in a high reflectance of 66.5%, i.e. increased by 0.4% as compared with Example 3.

Like in Example 1, for the purpose of reducing the film stress of the multilayer reflective film, the multilayer reflective film coated substrate was subjected to heat treatment at a heating temperature of 100° C. for 15 minutes. An interface between the uppermost Si film of the multilayer reflective film and the NbRu film was observed by the transmission electron microscope, but a diffusion layer where Si and NbRu were mixed was not confirmed. Further, this multilayer reflective film coated substrate was left standing in the atmosphere for 100 days, but there was no change in reflectance.

Then, like in Example 1, a buffer layer and an absorber layer were formed on the reflection enhancement film made of Ru, thereby obtaining a reflective mask blank and then a reflective mask. The reflectance of the EUV light in a reflection area of the obtained reflective mask hardly changed as compared with the reflectance measured in the form of the multilayer reflective film coated substrate and a high reflectance of 66.4% was maintained.

Further, pattern transfer onto a semiconductor substrate was carried out by the use of the apparatus shown in FIG. 2 and it was confirmed that the accuracy of the reflective mask of this Example was 16 nm or less being the required accuracy of the 70 nm design rule.

The following Examples 5 to 9 relate to the foregoing second embodiment.

Examples 5 to 7

Multilayer reflective film coated substrates were fabricated in the same manner as in Example 1 except that a material of a protective film was changed to ZrRu (Example 5), $Ru_2Y$ (Example 6), and $Ru_{25}Y_{44}$ (Example 7). Each of the protective films was formed by the ion beam sputtering method. The thickness of the ZrRu film of Example 5 was set to 2.2 nm, the thickness of the $Ru_2Y$ film of Example 6 was set to 2.0 nm, and the thickness of the $Ru_{25}Y_{44}$ film of Example 7 was set to 2.2 nm. Reflectance was measured by applying EUV light of 13.5 nm to each of the multilayer reflective films at an incident angle of 6.0 degrees, resulting in 65.8% (Example 5), 65.6% (Example 6), and 65.4% (Example 7), respectively.

Figure 6:
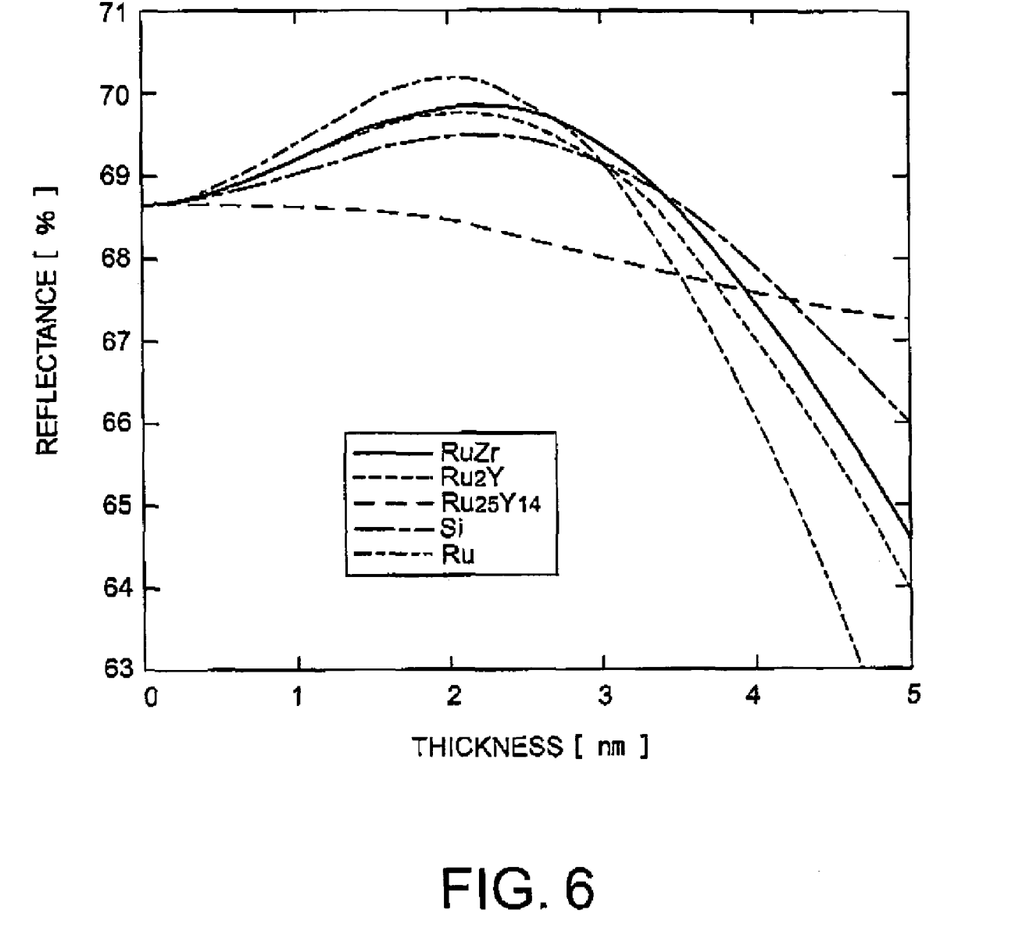
FIG. 6 is a diagram showing the film thickness dependency of reflectance when use was made of a ZrRu protective film of Example 5, a $Ru_2Y$ protective film of Example 6, and a $Ru_{25}Y_{44}$ protective film of Example 7.

FIG. 6 shows the film thickness dependency of reflectance when the protective films were made of the foregoing materials, respectively. The film thickness dependency of reflectance shown in FIG. 6 represents values calculated by an optical simulator and there is a case where the actual reflectance is reduced by 3 to 4% due to diffusion layers formed at interfaces between the Mo and Si layers, impurities contained in the Mo and Si layers, and so on. However, the relative relationship about reflectance magnitudes of the respective materials shown in FIG. 6 does not change. By taking a measure to minimize the foregoing diffusion layers and impurities, the actual reflectance can be made approximate to the reflectance values shown in FIG. 6. Maximum reflectances of 69.8% (Example 5), 69.6% (Example 6), and 69.4% (Example 7) can be achieved as theoretical values with a thickness of 2.2 nm in the case of ZrRu, 2.0 nm in the case of $Ru_2Y$, and 2.2 nm in the case of $Ru_{25}Y_{44}$. Further, since the thickness ranges of high reflectance are each wider than the Ru film, it is possible to set a thickness that can withstand long-time etching of a Cr-based buffer layer or an absorber layer formed on the protective film so that etching damage to the multilayer reflective film can be prevented.

For the purpose of reducing the film stress of the multilayer reflective films, the multilayer reflective film coated substrates were each placed on a hot plate and subjected to heat treatment at a heating temperature of 100° C. for 15 minutes. An interface between the uppermost Si film of the multilayer reflective film and each of the ZrRu film, the $Ru_2Y$ film, and the $Ru_{25}Y_{44}$ film was observed by the transmission electron microscope, but a diffusion layer was not confirmed. Further, the multilayer reflective film coated substrates were left standing in the atmosphere for 100 days, but there was no change in reflectance.

Then, by the use of the multilayer reflective film coated substrates, reflective mask blanks and then reflective masks were fabricated like in Example 1. In the case of the ZrRu, $Ru_2Y$, and $Ru_{25}Y_{44}$ protective films, the etching selectivities between the buffer layers and those protective films were 15:1, 12:1, and 13:1, respectively. The reflectance of the EUV light in reflection areas of the reflective masks in the respective Examples hardly changed, resulting in 65.7%, 65.6%, and 65.3%, respectively.

Further, pattern transfer onto semiconductor substrates was carried out by the use of the apparatus shown in FIG. 2 and it was confirmed that the accuracy of the reflective mask of each Example was 16 nm or less being the required accuracy of the 70 nm design rule.

Examples 8 and 9

Multilayer reflective film coated substrates were fabricated in the same manners as in Examples 5 and 6, respectively, except that, in Example 5, the thickness of a protective film made of ZrRu was set to 0.4 nm and a reflection enhancement film made of Ru was further formed to a thickness of 3.3 nm on the surface of the protective film and, in Example 6, the thickness of a protective film made of $Ru_2Y$ was set to 0.4 nm and a reflection enhancement film made of Ru was further formed to a thickness of 3.4 nm on the surface of the protective film (Examples 8 and 9). Reflectance was measured by applying EUV light of 13.5 nm to each of the multilayer reflective films at an incident angle of 6.0 degrees, resulting in high reflectances of 66.2% (Example 8) and 66.1% (Example 9), i.e. increased by 0.4% and 0.5% as compared with Examples 5 and 6, respectively.

Like in Examples 5 and 6, for the purpose of reducing the film stress of the multilayer reflective films, the multilayer reflective film coated substrates were subjected to heat treatment at a heating temperature of 100° C. for 15 minutes. An interface between the uppermost Si film of the multilayer reflective film and each of the ZrRu film and the $Ru_2Y$ film was observed by the transmission electron microscope, but a diffusion layer where Si and ZrRu or Si and $Ru_2Y$ were mixed was not confirmed. Further, the multilayer reflective film coated substrates were left standing in the atmosphere for 100 days, but there was no change in reflectance.

Then, like in Example 1, a buffer layer and an absorber layer were formed on each of the reflection enhancement films made of Ru, thereby obtaining reflective mask blanks and then reflective masks. The reflectance of the EUV light in reflection areas of the obtained reflective masks hardly changed as compared with the reflectance measured in the form of the multilayer reflective film coated substrates and high reflectances of 66.1% (Example 8) and 66.1% (Example 9) were maintained, respectively.

Further, pattern transfer onto semiconductor substrates was carried out by the use of the apparatus shown. In FIG. 2 and it was confirmed that the accuracy of the reflective mask of each Example was 16 nm or less being the required accuracy of the 70 nm design rule.

The following Examples 10 to 18 relate to the foregoing third embodiment.

Examples 10 to 15

Multilayer reflective film coated substrates were fabricated in the same manner as in Example 1 except that a material of a protective film was changed to $Ru_7B_3$ (Example 10), RuB (Example 11), $Ru_2B_3$ (Example 12), $RuB_2$ (Example 13), TiRu (Example 14), and $LaRu_2$ (Example 15). Each of the protective films was formed by the ion beam sputtering method. The thickness of the $Ru_7B_3$ film of Example 10 was set to 2.0 nm, the thickness of the RuB film of Example 11 was set to 2.1 nm, the thickness of the $Ru_2B_3$ film of Example 12 was set to 2.1 nm, the thickness of the $RuB_2$ film of Example 13 was set to 2.1 nm, the thickness of the TiRu film of Example 14 was set to 1.5 nm, and the thickness of the $LaRu_2$ film of Example 15 was set to 1.5 nm.

Reflectance was measured by applying EUV light of 13.5 nm to each of the multilayer reflective films at an incident angle of 6.0 degrees, resulting in 65.9% (Example 10), 65.7% (Example 11), 65.6% (Example 12), 65.6% (Example 13), 65.3% (Example 14), and 64.9% (Example 15), respectively.

For the purpose of reducing the film stress of the multilayer reflective films, the multilayer reflective film coated substrates were each placed on a hot plate and subjected to heat treatment at a heating temperature of 100° C. for 15 minutes. An interface between the uppermost Si film of the multilayer reflective film and each of the $Ru_7B_3$ film, the RuB film, the $Ru_2B_3$ film, the $RuB_2$ film, the TiRu film, and the $LaRu_2$ film was observed by the transmission electron microscope, but a diffusion layer was not confirmed. Further, the multilayer reflective film coated substrates were left standing in the atmosphere for 100 days, but there was no change in reflectance.

Then, by the use of the multilayer reflective film coated substrates, reflective mask blanks and then reflective masks were fabricated like in Example 1. In the case of the $Ru_7B_3$, RuB, $Ru_2B_3$, $RuB_2$, TiRu, and $LaRu_2$ protective films, the etching selectivities between the buffer layers and those protective films were 15:1, 15:1, 15:1, 14:1, 12:1, and 18:1, respectively. The reflectance of the EUV light in reflection areas of the reflective masks in the respective Examples was 65.8% (Example 10), 65.7% (Example 11), 65.4% (Example 12), 65.6% (Example 13), 65.2% (Example 14), and 64.8% (Example 15), respectively.

Further, pattern transfer onto semiconductor substrates was carried out by the use of the apparatus shown in FIG. 2 and it was confirmed that the accuracy of the reflective mask of each Example was 16 nm or less being the required accuracy of the 70 nm design rule.

Examples 16 to 18

Multilayer reflective film coated substrates were fabricated in the same manners as in Examples 11, 14, and 15, respectively, except that, in Example 11, the thickness of a protective film made of RuB was set to 0.4 nm and a reflection enhancement film made of Ru was further formed to a thickness of 3.5 nm on the surface of the protective film, in Example 14, the thickness of a protective film made of TiRu was set to 0.4 nm and a reflection enhancement film made of Ru was further formed to a thickness of 3.3 nm on the surface of the protective film, and, in Example 15, the thickness of a protective film made of $LaRu_2$ was set to 0.4 nm and a reflection enhancement film.

Then, like in Examples 11, 14, and 15, a buffer layer and an absorber layer were formed on each of the reflection enhancement films made of Ru, thereby obtaining reflective mask blanks and then reflective masks. The reflectance of the EUV light in reflection areas of the obtained reflective masks in the respective Examples hardly changed as compared with the reflectance measured in the form of the multilayer reflective film coated substrates and high reflectances of 65.9% (Example 16), 65.7% (Example 17), and 65.4% (Example 18) were maintained, respectively.

Further, pattern transfer onto semiconductor substrates was carried out by the use of the apparatus shown in FIG. 2 and it was confirmed that the accuracy of the reflective mask of each Example was 16 nm or less being the required accuracy of the 70 nm design rule.

Example 19

As a multilayer reflective film formed on a substrate fabricated in Example 1, a Mo film/Si film set multilayer reflective film was adopted so as to obtain a multilayer reflective film suitable for an exposure wavelength band of 13 to 14 nm. That is, the multilayer reflective film was formed by using a Mo target and a Si target and alternately layering Mo films and Si films on the substrate by ion beam sputtering. At first, a Si film was deposited to a thickness of 4.2 nm by the use of the Si target, then a Mo film was deposited to a thickness of 2.8 nm by the use of the Mo target and, given that this formed one cycle, films were layered by 40 cycles and then a Si film was deposited to a thickness of 4.2 nm, and finally, a MoRuN film was deposited to a thickness of 2.1 nm as a protective film by using a $Mo_{63}Ru_{37}$ target and ion-irradiating a nitrogen ($N_2$) gas by the use of an assist gun, thereby obtaining a multilayer reflective film coated substrate. Reflectance was measured by applying EUV light of 13.5 nm to the multilayer reflective film at an incident angle of 6.0 degrees and it was 65.7%. Further, the surface roughness of the multilayer reflective film was 0.13 nmRms.

For the purpose of reducing the film stress of the multilayer reflective film, the multilayer reflective film coated substrate was placed on a hot plate and subjected to heat treatment at a heating temperature of 100° C. for 15 minutes. An interface between the uppermost Si film of the multilayer reflective film and the MoRuN film was observed by the transmission electron microscope, but a diffusion layer where Si and MoRuN were mixed was not confirmed. Further, this multilayer reflective film coated substrate was left standing in the atmosphere for 100 days, but there was no change in reflectance.

Then, by the use of the multilayer reflective film coated substrate, a reflective mask blank and then a reflective mask were fabricated like in Example 1. In the case of the MoRuN protective film, the etching selectivity between the buffer layer and the protective film was 15:1. The reflectance of the EUV light in a reflection area of the reflective mask was 65.6%.

Further, pattern transfer onto a semiconductor substrate was carried out by the use of the apparatus shown in FIG. 2 and it was confirmed that the accuracy of the reflective mask of this Example was 16 nm or less being the required accuracy of the 70 nm design rule.

Now, Comparative Example to the foregoing Examples will be described.

Comparative Example

Like in Example 1, on a substrate, by Ion beam sputtering, a Si film was deposited to a thickness of 4.2 nm, then a Mo film was deposited to a thickness of 2.8 nm and, given that this formed one cycle, films were layered by 40 cycles and then a Si film was deposited to a thickness of 4.2 nm, and finally, a Ru film was deposited to a thickness of 2.0 nm as a protective film, thereby obtaining a multilayer reflective film coated substrate. Reflectance was measured by applying EUV light of 13.5 nm to the multilayer reflective film at an incident angle of 6.0 degrees and it was 66.1%.

The multilayer reflective film coated substrate was placed on a hot plate and subjected to heat treatment at a heating temperature of 100° C. for 15 minutes. An interface between the uppermost Si film of the multilayer reflective film and the Ru film was observed by the transmission electron microscope, and a diffusion layer of about 2.2 nm where Si and Ru were mixed was confirmed.

Then, by the use of the multilayer reflective film coated substrate, a reflective mask blank and then a reflective mask were fabricated like in Example 1. In the case of the Ru protective film, the etching selectivity between the buffer layer and the protective film was 15:1. The reflectance of the EUV light in a reflection area of the reflective mask was 65.5%, i.e. reduced by 0.6%. This is considered to be caused by the fact that the diffusion layer was expanded due to thermal factors such as the foregoing heat treatment and prebake treatment of a resist film.

In each of the foregoing Examples, since a diffusion layer is not formed at the interface between the uppermost Si film of the multilayer reflective film and the protective film even if the heat treatment or the like is carried out, it is possible to prevent the reduction in reflectance. Therefore, the EUV light reflectance in the reflection area of the manufactured reflective mask hardly changes as compared with the reflectance measured in the form of the multilayer reflective film coated substrate and thus the reflectance is stable. Further, by forming the reflection enhancement film made of Ru particularly on the surface of the protective film, higher reflectance can be achieved so that the high reflectance is maintained even if the heat treatment or like is carried out. In contrast, in the foregoing Comparative Example, the diffusion layer is formed at the interface between the uppermost Si film of the multilayer reflective film and the protective film and expanded due to the thermal factors such as the heat treatment and, therefore, the reduction in reflectance increases. As a result, the EUV light reflectance in the reflection area of the manufactured reflective mask largely changes from the reflectance measured in the form of the multilayer reflective film coated substrate and, therefore, the stable reflectance is not obtained and thus the reliability is low.

In each of the foregoing Examples, the description has been made only about the case where the buffer layer is formed between the protective film or the reflection enhancement film and the absorber layer in the reflective mask blank or the reflective mask. However, this invention is not limited thereto, but is also applicable to a reflective mask blank or a reflective mask having no buffer layer.

What is claimed is:

1. A reflective mask blank comprising:
   a substrate,
   a multilayer reflective film on said substrate to reflect exposure light,
   a protective film on said multilayer reflective film to protect said multilayer reflective film from being etched, and
   an absorber layer covered on said protective film to absorb the exposure light,
   wherein said multilayer reflective film has an uppermost film of silicon contacted with said protective film, and
   wherein said protective film is formed by a ruthenium compound containing ruthenium (Ru) and at least one selected from the group consisting of molybdenum (Mo), niobium (Nb), zirconium (Zr), yttrium (Y), boron (B), titanium (Ti), and lanthanum (La).

2. A reflective mask blank according to claim 1, wherein said protective film further contains nitrogen (N).

3. A reflective mask blank according to claim 1, further comprising a chromium-based buffer layer between said protective film and said absorber layer, said chromium-based buffer layer containing chromium (Cr) and having etching characteristics different from those of said absorber layer.

4. A reflective mask blank according to claim 1, further comprising a reflection enhancement film between said protective film and said absorber layer, said reflection enhancement film being substantially made of ruthenium (Ru).

5. A reflective mask blank according to claim 3, further comprising a reflection enhancement film between said protective film and said chromium-based buffer layer, said reflection enhancement film being substantially made of ruthenium (Ru).

6. A reflective mask blank according to claim 1, wherein said multilayer reflective film is subjected to heat treatment.

7. A reflective mask having an absorber layer pattern that is formed as a transfer pattern onto a transfer target by patterning the absorber layer of the reflective mask blank according to claim 1.

8. A method of manufacturing a semiconductor device by forming a fine pattern on a semiconductor substrate by a lithography technique by using the reflective mask according to claim 7.

9. A reflective mask blank comprising a substrate, a multilayer reflective film on said substrate to reflect exposure light, a protective film on said multilayer reflective film to protect said multilayer reflective film from being etched, and an absorber layer covered on said protective film to absorb the exposure light,
   wherein said multilayer reflective film has an uppermost film of silicon contacted with said protective film, and
   said protective film is formed by a ruthenium compound containing (1) not only ruthenium (Ru) but also (2) at least one selected from the group consisting of molybdenum (Mo), niobium (Nb), zirconium (Zr), yttrium (Y), boron (B), titanium (Ti), and lanthanum (La).

* * * * *